United States Patent Office 3,489,562

Patented Jan. 13, 1970

3,489,562

PRINTING PLATE COMPRISING A PHOTO-POLYMERIZABLE COMPOSITION

Carl-Heinrich Krauch, Heidelberg, Ernst-August Hackmann, Wiesbaden-Dotzheim, Germany, assignors to Kalle Aktiengesellschaft, Wiesbaden-Biebrich, Germany, a corporation of Germany No Drawing. Filed Aug. 24, 1967, Ser. No. 662,864
Claims priority, application Switzerland, Aug. 26, 1966, 12,411/66
Int. Cl. G03c *1/68, 5/00*
U.S. Cl. 96—35.1 24 Claims

ABSTRACT OF THE DISCLOSURE

This invention relates to a light-sensitive reproduction material particularly for use in the preparation of printing plates. The reproduction material includes a reproduction layer comprising at least one olefinically-unsaturated photopolymerizable compound and at least one dioxene derivative or α-keto-oxetane derivative which initiates polymerization of the olefinically-unsaturated photopolymerizable compound upon exposure of the latter to light.

Light-sensitive reproduction layers for printing plates are known which contain polymerizable compounds having olefinic double bonds and components which, upon exposure to light, initiate the polymerization of these compounds. Upon image-wise exposure of such layers, the layer polymerizes in the areas affected by light, thus changing the solubility characteristics thereof. By treatment with a suitable solvent, the layer is then removed in the unexposed areas and an offset printing plate or a relief printing plate is the result, depending upon the kind of support used and the thickness of the layer.

In most cases, the known reproduction layers contain vinyl or vinylidene derivatives as polymerizable monomeric substances, and peroxides, ketones, keto-aldonyl compounds, α-keto-aldonyl alcohols, and acyloin ethers and the like as substances which initiate polymerization during exposure. Various combinations of these groups of substances are known; special binders also are included in the reproduction layer in most cases.

Further, it is known that a higher degree of light-sensitivity normally can be achieved with printing plates of the above-described type by causing the photo-polymerization of the reproduction layer to proceed with the exclusion of oxygen. This may be achieved by introducing the printing plate into an inert atmosphere, e.g. a carbon dioxide atmosphere, and exposing it to light in this condition. However, this method is time-consuming and cumbersome and is, therefore, only infrequently employed.

The present invention provides a printing plate, including polymerizable monomeric substances with olefinic double bonds in the light-sensitive layer thereof, which has good processing qualities and performance and the light-sensitivity of which is independent of the oxygen content.

The present invention is an improvement on known printing plates having light-sensitive reproduction layers which contain at least one polymerizable compound having an olefinic double bond, at least one compound which initiates polymerization of the polymerizable compound during exposure, and, if desired, polymeric organic binders. In the plates of the present invention, the light-sensitive reproduction layer contains, as the compounds which initiate polymerization during exposure, dioxene derivatives or α-keto-oxetane derivatives of the following general formulae:

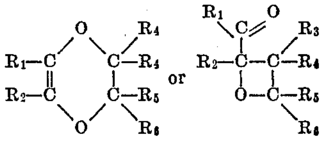

(1) (2)

In these general formulae:

$R_1$ and $R_2$ are hydrogen or substituted or unsubstituted alkyl, cycloalkyl, aryl, aralkyl or heteroyl groups, the groups $R_1$ and $R_2$ taken together forming a saturated or unsaturated, substituted or unsubstituted ring, and $R_3$, $R_4$, $R_5$ and $R_6$ are hydrogen, halogen, or substituted or unsubstituted alkyl, cycloalkyl, aryl, aralkyl or heteroyl groups, with at least one of the groups $R_3$, $R_4$, $R_5$ and $R_6$ being halogen and two of the groups $R_3$, $R_4$, $R_5$ and $R_6$ taken together forming a saturated or unsaturated, substituted or unsubstituted ring.

The preparation of such dioxene derivatives and α-keto-oxetane derivatives is known and is described on pages 1881–1891 of the periodical "Chemische Berichte," vol. 99, 1966. 1,2-dicarbonyl compounds of the general Formula 3

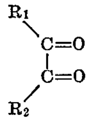

(3)

wherein the groups $R_1$ and $R_2$ are as stated above, are reacted with an olefinically-unsaturated compound of the general Formula 4

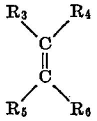

(4)

wherein the groups $R_3$, $R_4$, $R_5$ and $R_6$ also are as stated above, by selective irradiation with light of a wave length corresponding to that of a longer wave length secondary maximum of the 1,2-dicarbonyl compound employed. Dioxene derivatives and oxetane derivatives which are preferably employed are:

Formula I

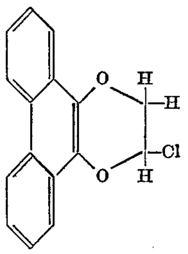

Formula II

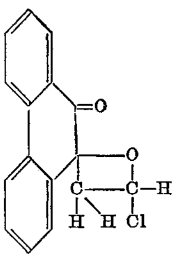

Formula III

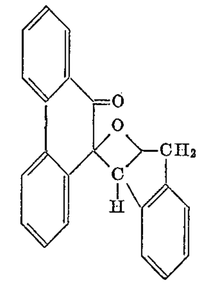

Formula IV

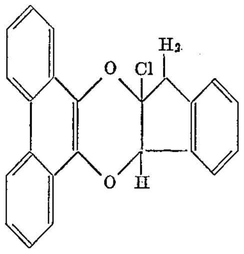

Formula V

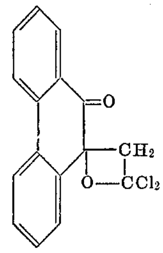

Formula VI

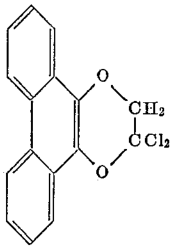

Formula VII

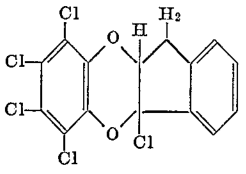

The dioxene derivatives and α-keto-oxetane derivatives of the general Formulae 1 and 2 have in common that, upon irradiation with light of a wave length preferably below 400 mμ, they liberate hydrogen halide in a photochemical reaction. It is assumed that this compound acts as a polymerization initiator for the compounds having olefinic double bonds. On the other hand, it also seems possible that polymerization of the monomeric compounds is caused by unstable, probably radical, intermediate products of the photochemical reaction of the dioxene or α-keto-oxetane derivatives.

As polymerizable compounds having olefinic double bonds, compounds containing vinyl groups as well as compounds containing vinylidene groups are used, and also compounds in which three or four hydrogen atoms of the ethylene group are substituted. Solid or difficulty volatile liquid monomers are preferred. However, since it is preferred to add polymeric binders, as shown below, it is in principle possible to also use more readily volatile monomeric compounds, provided an appropriate binder is employed. Mixtures of several monomeric compounds also may be contained in the reproduction layer.

N-vinyl carbazole and substituted N-vinyl carbazoles, e.g. 3,6-dibromo-N-vinyl carbazole and 3,6-dimethyl-N-vinyl-carbazole, are especially suitable. Substituted vinyl triazoles and vinyl dibenzofuranes also may be employed. Acrylonitriles, methacrylonitriles, substitution products of acrylic acid, methacrylic acid, acryl amides, methacryl amides, vinyl pyrrolidones, vinyl acetates, vinyl ethers, e.g. isobutyl vinyl ether, and dienes, e.g. butadiene derivatives, also may be used.

Stilbene and styrene derivatives also may be used. Acenaphthylene is a very suitable compound of the vinylidene group. All these compounds having olefinic double bonds may be contained in the reproduction layer either individually or in admixture with one another.

The proportion of polymerizable substance to the dioxene or α-keto-oxetane derivatives may vary within wide limits. Additions of not more than 0.05 part by weight of the latter substances per part by weight of polymerizable substance are sufficient to initiate the polymerization of the latter under the influence of light. Considerably larger quantities of the initiator also may be employed. When 2 parts by weight of dioxene derivative or α-keto-oxetane derivative are used per part by weight of polymerizable substance, a relatively fast photopolymerization process results. It is remarkable that, with such a mixing ratio, the exposed areas of the reproduction layer also become completely solid and as insoluble as in the case where a smaller proportion of initiator is employed. This indicates that the compounds produced from the dioxene or α-keto-oxetane derivatives by the photoreaction are incorporated in the polymeric compound formed. This means that large additions of the initiator may be employed without adverse effects, thus causing a very high degree of light-sensitivity of the reproduction layer, which can not be achieved with the hitherto known photochemical catalysts. A mixing ratio of 0.5 to 1 part by weight of dioxene derivative or α-keto-oxetane derivative per part by weight of polymerizable compound is preferred.

Insofar as the polymerizable compounds are by themselves adequately film-forming, they may be applied directly to the support together with the initiator. However, since this frequently is not the case, it is advantageous to use reproduction layers which also contain resins in addition to the polymerizable compound and the dioxene or α-keto oxetane derivatives. Besides effecting a better adhesion of the reproduction layer to the support, the resins prevent partial crystallization of the layer and render it more easily developable. In order to utilize this improved developability, it is necessary that the binders readily dissolve in developers which do not attack the photopolymerized layer.

Suitable binders are, e.g.: resins containing groups which render them soluble in alkalies, e.g. acid anhydride groups, carboxyl groups, sulfonic acid groups, and sulfonamide or sulfonimide groups. Resins having high acid numbers are preferred because they are particularly readily soluble in aqueous alkaline solutions. Copolymers of styrene and maleic anhydride are particularly suitable.

Reaction products of formaldehyde/phenol polycondensates or formaldehyde/cresol polycondensates with chloroacetic acid, such as are described, e.g., in German patent specification No. 1,053,930, are also very suitable.

Further resins are suitable which are soluble in aqueous acid solutions having a pH-value of about 3.5 to 6.5. These include formaldehyde polycondensates of N,N-dialkyl-anilines, preferably of dimethyl aniline and substituted dialkyl anilines, and also polyvinyl quinoline and other basic polymers of nitrogen-containing heterocyclic vinyl compounds.

Polymers which are soluble in neutral water, such as polyvinyl alcohol, poly-N-methyl-N-vinyl acetamide, polyvinyl-N-methyl-formamide and polyvinyl pyrrolidone, are also suitable as binders.

Binders which require development of the reproduction layer by means of organic solvents, are, e.g.: polyvinyl acetate, polystyrene of relatively low molecular weight, cellulose acetate having an acetyl group content between 28 and 48 percent, polyvinyl chloride, polyvinylidene chloride, straight-chain and branched-chain aliphatic hydrocarbons having from 10 to 80 C-atoms, and natural and synthetic waxes.

The binders also may be contained in the reproduction layer either individually or in admixture with one another. Their content in the reproduction layer may vary within wide limits, but is dependent to some degree on the kind of binder used. Some binders, e.g. non-hardenable, spirit-soluble phenol resins, may be contained in the layer in quantities ranging from 2 to 50 percent by weight, based on the weight of the monomeric compound. Other binders have an even wider range, whereas still others have a somewhat narrower range. As a rule, favorable results are obtained with a binder content from 1 to 50 percent by weight, based on the monomer content of the reproduction layer.

Normally, the printing plates of the invention consist of a support and a reproduction layer thereon. Alternatively, the reproduction layer may constitute the printing plate when it is in the form of a self-supporting film.

Suitable supports for the reproduction layer are all known materials used for this purpose, e.g. aluminum, zinc, magnesium or copper plates, but also cellulose products, such as special kinds of paper, or films of cellulose hydrate, cellulose acetate and cellulose butyrate, the latter most advantageously being in a partially saponified form. Films of other plastics also may be used, e.g. polyamide films or polyethylene terephthalate films.

Depending upon whether the printing plate is to be processed into an offset printing form, or whether it is to be converted into a relief printing form in known manner by etching, or a relief printing form consisting of the material of the reproduction layer is to be prepared, a suitable support will be selected from the supports mentioned above.

The printing plates according to the present invention are prepared in known manner. A solution which contains at least one dioxene derivative or α-keto-oxetane derivative of the general Formulae 1 and 2 above, at least one monomeric polymerizable compound with an olefinic double bond, and, if desired, one or more binders in an organic solvent or a solvent mixture is applied to the support.

A mixture of acetone and benzene is preferred as the solvent. However, other solvents customarily used for this purpose also are suitable. Coating also is effected in known manner, by whirl-coating or brushing in a coating machine. The thickness of the layer is dependent upon the intended use of the printing plate. For offset printing plates, layers of 2 to 20$\mu$ are preferred, the thicker layers being employed for longer runs. If a relief printing form is to be prepared by etching, layers having a thickness of 1 to 15$\mu$ are recommended. Finally, if relief printing images are to be prepared from the reproduction layer by dissolving away the unexposed areas, the layers may have a thickness up to several hundred $\mu$. However, in this case it is advisable to prepare a two-layer coating in known manner, the lower layer of which contains more of the polymerization-initiating substance than the upper layer. In addition, an anti-halation layer must be applied directly to the support. The coating solutions are adjusted in such a manner and applied in such quantities that, after evaporation of the solvent, layers are produced which have the above thicknesses, are sufficiently hard, and are non-tacky. Normally, this can be achieved by selecting suitable binders. In cases where a non-tacky layer is not satisfactorily produced by the addition of a suitable binder, inorganic fillers, e.g. silica, bentonite, quartz or glass powder, or aluminum oxide, may be incorporated in the photo-polymerizable layer provided their particles are of a size considerably below the thickness of the layer.

Self-supporting reproduction layers may be manufactured by casting or extrusion.

Processing of the printing plates of the invention is effected in known manner. Normally, the material is exposed by the contact process, but episcopic or diascopic exposure also are possible.

Screening of the material by means of a contact or engraved glass screen produces excellent results. Negative masters are preferably employed, because the reproduction material of the invention reverses the tone values and thus yields positive copies from negative masters. Upon exposure, a weak but visible image is formed in the reproduction layer.

Since the maximum light-sensitivity of the dioxene derivatives and α-keto-oxetane derivatives is in the ultraviolet range of the spectrum, the light source used must be adequately intense in this light range. Light sources of this kind are, e.g., carbon arc lamps, mercury vapor lamps, fluorescent lamps containing luminescent masses which primarily emit ultraviolet light, and argon glow lamps. Mercury vapor lamps are preferred.

Fixing after exposure is required, because the unexposed areas are still light-sensitive. Normally, fixing is effected by wiping the plate with a suitable solvent mixture which dissolves the unexposed areas of the layer, but does not attack the exposed areas. The image areas, consisting of the polymerized layer, are hydrophobic and accept greasy printing ink.

Since the photo-polymerized areas of the reproduction layer are also resistant to acids in most cases, it is possible to deep-etch the image background by a one- or two-step etching process so that relief printing forms are produced.

If printing plates are to be prepared from which only short runs are expected, it is not necessary to expose the reproduction layer until it is thoroughly polymerized. Complete exposure is, however, advisable when long-run printing plates are to be prepared. Complete cross-linking in the image areas of the reproduction layer is always achieved by heating the printing plate for a short time to temperatures above 100° C., after removal of the unexposed areas. This is of special advantage with high contents of dioxene or α-keto-oxetane derivatives.

The printing plates of the present invention have the advantage that they can be rendered more light-sensitive than known printing plates of comparable structure, because the content of the polymerization-initiating substance can be increased and the plates are not sensitive to oxygen.

The invention will be further illustrated by the following specific examples:

EXAMPLE 1

2 g. of N-vinyl carbazole and 2 g. of the compound of Formula II above are dissolved in 40 ml. of acetone, and an aluminum foil is whirl-coated with this solution. After evaporation of the solvent, the plate is exposed for 2 minutes under a negative master, using a carbon arc lamp, and then decoated by means of an alkaline developer. The developer consists of a solution of sodium metascilicate (5 parts by weight) in a mixture of water (20 parts by weight), methanol (20 parts by weight), glycerol (20 parts by weight) and ethyleneglycol (30 parts by weight). During development, the unexposed areas are removed from the aluminum support. The plate is rendered hydrophilic in the decoated areas by treatment with dilute phosphoric acid and then inked up with greasy ink. Ink is accepted by the exposed areas only. The printing plate thus prepared may be used for printing in an offset printing machine.

EXAMPLE 2

By adding 1 g. of a non-hardenable, spirit-soluble novolak (Alnovol® 429 k. sold by Chemische Werke Albert, Wiesbaden-Biebrich, Germany) to the solution described in Example 1, a more rapid decoating of the exposed printing plate by the developer used above is achieved. Otherwise, the results are similar to those obtained in Example I.

EXAMPLE 3

2 g. of the compound of Formula III above and 2 g. of N-vinyl carbazole are dissolved in 40 ml. of benzene, and the procedure of Example 1 is repeated. Similar results are obtained.

EXAMPLE 4

2 g. of the compound of Formula I above, 2 g. of N-vinyl carbazole, and 1 g. of a non-hardenable, spirit-soluble novolak (Alnovol®, sold by Chemische Werke Albert, Wiesbaden-Biebrich, Germany) are dissolved in 20 ml. of benzene and 20 ml. of acetone, and the procedure described in Example 1 is repeated. A similar result is obtained.

EXAMPLE 5

Similar results are obtained by replacing the aluminum foil used in Example 4 by the acetate film laminated to paper.

EXAMPLE 6

200 mg. of one of the compounds of Formulae I to VII above, 320 mg. of N-vinyl carbazole, and 320 mg. of a spirit-soluble novolak Alnovol® 429 k, sold by Chemische Werke Albert, Wiesbaden-Biebrich, Germany) are dissolved in 10 ml. of acetone and 10 ml. of benzene, and the procedure described in Example 1 is followed in each case. In the following table, the exposure times necessary to obtain a firmly adhering image on the plate after exposure and development are listed:

| Light-sensitive compound: | Exposure time, in seconds |
|---|---|
| I | 60 |
| II | 15 |
| III | 15 |
| IV | 120 |
| V | 60 |
| VI | 180 |
| VII | 30 |

The printing plates thus prepared may be used for printing in an offset printing machine.

It will be obvious to those skilled in the art that many modifications may be made within the scope of the present invention without departing from the spirit thereof, and the invention includes all such modifications.

What is claimed is:

1. A light-sensitive reproduction layer which comprises at least one olefinically-unsaturated polymerizable first compound and at least one second compound which initiates polymerization of the first compound upon exposure to light, the second compound being selected from the group consisting of dioxene derivatives and α-keto-oxetane derivatives having the formulae

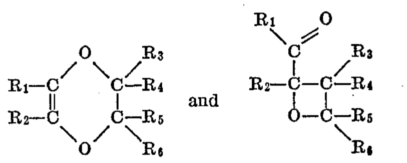

(1) (2)

in which $R_1$ and $R_2$ are selected from the group consisting of hydrogen, alkyl, cycloalkyl, aryl, aralkyl and heteroyl groups: $R_1$ and $R_2$ taken together forming a ring; and $R_3$, $R_4$, and $R_5$ and $R_6$ selected from the group consisting of hydrogen, halogen, alkyl, cycloalkyl, aryl, aralkyl and heteroyl groups, at least one of $R_3$, $R_4$, $R_5$ and $R_6$ being halogen; and two of $R_3$, $R_4$, $R_5$ and $R_6$ taken together forming a ring.

2. A light-sensitive layer according to claim 1 in the form of a self-supporting film.

3. A light-sensitive layer according to claim 1 on a support.

4. A light-sensitive layer according to claim 1 in which the second compound has the formula

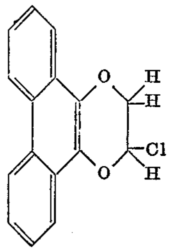

5. A light-sensitive layer according to claim 1 in which the second compound has the formula

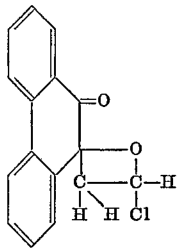

6. A light-sensitive layer according to claim 1 in which the second compound has the formula

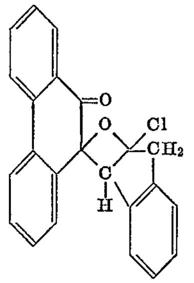

7. A light-sensitive layer according to claim 1 in which the second compound has the formula

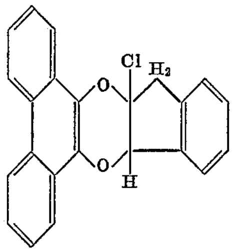

8. A light-sensitive layer according to claim 1 in which the second compound has the formula

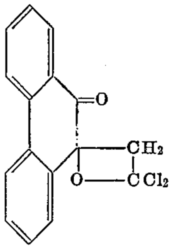

9. A light-sensitive layer according to claim 1 in which the second compound has the formula

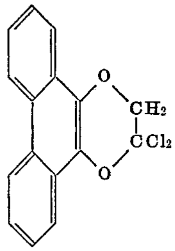

10. A light-sensitive layer according to claim 1 in which the second compound has the formula

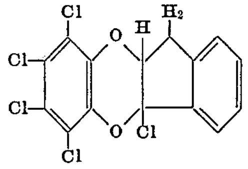

11. A light-sensitive layer according to claim 1 containing about 0.05 to 2 parts by weight of the second compound per part by weight of the first compound.

12. A light-sensitive layer according to claim 1 including a polymeric organic binder material.

13. A process for developing light-sensitive reproduction material which comprises exposing a light-sensitive layer to light under a master and developing the resulting image, the layer comprising at least one olefinically-unsaturated polymerizable first compound and at least one second compound which initiates polymerization of the first compound upon exposure to light, the second compound being selected from the group consisting of dioxene derivatives and α-keto-oxetane derivatives having the formulae

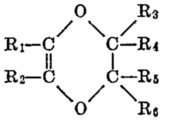
and
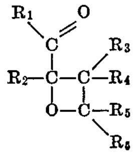

(1) (2)

in which $R_1$ and $R_2$ are selected from the group consisting of hydrogen, alkyl, cycloalkyl, aryl, aralkyl and heteroyl groups; $R_1$ and $R_2$ taken together forming a ring; and $R_3$, $R_4$, $R_5$ and $R_6$ are selected from the group consisting of hydrogen, halogen, alkyl, cycloalkyl, aryl, aralkyl and heteroyl groups, at least one of $R_3$, $R_4$, $R_5$ and $R_6$ being halogen; and two of $R_3$, $R_4$, $R_5$ and $R_6$ taken together forming a ring.

14. A process according to claim 13 in which the layer is in the form of a self-supporting film.

15. A process according to claim 13 in which the layer is on a support.

16. A process according to claim 13 in which the second compound has the formula

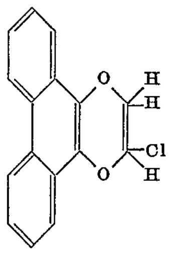

17. A process according to claim 13 in which the second compound has the formula

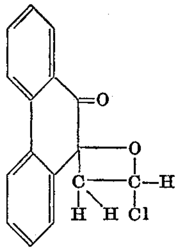

18. A process according to claim 13 in which the second compound has the formula

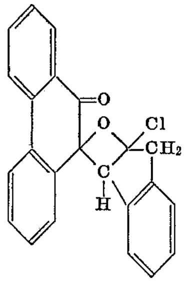

19. A process according to claim 13 in which the second compound has the formula

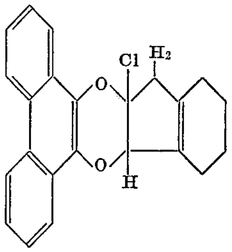

20. A process according to claim 13 in which the second compound has the formula

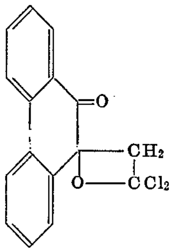

21. A process according to claim 13 in which the second compound has the formula

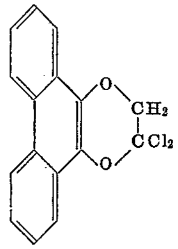

22. A process according to claim 13 in which the second compound has the formula

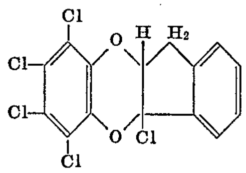

23. A process according to claim 13 in which the layer contains about 0.05 to 2 parts by weight of the second compound per part by weight of the first compound.

24. A process according to claim 13 in which the layer includes a polymeric organic binder material.

References Cited

UNITED STATES PATENTS

| | | | |
|---|---|---|---|
| 3,016,297 | 1/1962 | Mochel et al. | 96—35 |
| 2,934,544 | 4/1960 | Cripps | 260—365 |

NORMAN G. TORCHIN, Primary Examiner

RONALD H. SMITH, Assistant Examiner

U.S. Cl. X.R.

96—115; 204—159.23